United States Patent
Noguchi et al.

[11] Patent Number: 5,976,691
[45] Date of Patent: Nov. 2, 1999

[54] PROCESS FOR PRODUCING CHIP AND PRESSURE SENSITIVE ADHESIVE SHEET FOR SAID PROCESS

[75] Inventors: Hayato Noguchi, Urawa; Yoshihisa Mineura, Tokyo; Hideki Numazawa, Urawa; Kazuyoshi Ebe, Saitama, all of Japan

[73] Assignee: Lintec Corporation, Japan

[21] Appl. No.: 08/992,549

[22] Filed: Dec. 17, 1997

[30] Foreign Application Priority Data

Dec. 19, 1996 [JP] Japan .................................. 8-340185

[51] Int. Cl.⁶ ........................................................ B32B 7/12
[52] U.S. Cl. ........................... 428/354; 428/343; 428/345
[58] Field of Search .................................. 428/343, 345, 428/354, 355 EN, 355 AC, 355 N, 356, 40.1

[56] References Cited

U.S. PATENT DOCUMENTS

| | | | |
|---|---|---|---|
| 4,756,968 | 7/1988 | Ebe et al. | 428/343 |
| 4,761,335 | 8/1988 | Aurichio et al. | 428/352 |
| 4,965,127 | 10/1990 | Ebe et al. | 428/343 |
| 4,999,242 | 3/1991 | Ishiwata et al. | 428/345 |
| 5,187,007 | 2/1993 | Ebe et al. | 428/343 |
| 5,304,418 | 4/1994 | Akada et al. | 428/345 |
| 5,637,395 | 6/1997 | Uemura et al. | 428/343 |

FOREIGN PATENT DOCUMENTS

| | | |
|---|---|---|
| 0157508 | 9/1985 | European Pat. Off. . |
| 0622833 | 2/1994 | European Pat. Off. . |

OTHER PUBLICATIONS

Japanese Patent Laid–Open No. 6–16524, Abstract, Mar. 2, 1994, 1 p., Japanese language.
Japanese Patent Laid–Open No. 60–223139, Abstract, Nov. 7, 1985, 1 p., English language.
Japanese Patent Laid–Open No. 9165558, Abstract, Jun. 24, 1997, 1 p., English language.
Japanese Patent Laid–Open No. 8258038, Abstract, Oct. 8, 1996, 1 p., English language.
Japanese Patent Laid–Open No. 8225776, Abstract, Sep. 3, 1996, 1 p., English language.
Japanese Patent Laid–Open No. 5–132946, Abstract, Feb. 9, 1993, 1 p., English language.
Japanese Patent Laid–Open No. 60–196956, Abstract, Oct. 5, 1985, 1 p., English language.

*Primary Examiner*—Daniel Zirker
*Attorney, Agent, or Firm*—Webb Ziesenheim Logsdon Orkin & Hanson, P.C.

[57] ABSTRACT

A process for producing a chip, comprising the steps of:
  a attaching an object to be diced on a pressure sensitive adhesive sheet comprising at least one layer of shrinkable film and a pressure sensitive adhesive layer;
  dicing the object into chips, and
  shrinking the shrinkable film to thereby reduce an area in which the chips are in contact with the pressure sensitive adhesive. In this process, chips of small thickness and large area can easily be picked up without the need to use a thrust needle in the chip pickup step.

4 Claims, 1 Drawing Sheet

PROCESS FOR PRODUCING CHIP AND PRESSURE SENSITIVE ADHESIVE SHEET FOR SAID PROCESS

FIELD OF THE INVENTION

The present invention relates to a process for producing a small item such as an electronic component and an optical component (hereinafter referred to as "chip") and a pressure sensitive adhesive sheet suitable for use in the above process.

BACKGROUND OF THE INVENTION

A semiconductor wafer of, for example, silicon or gallium arsenide is produced in a large diameter, cut and separated (diced) into elemental chips and subjected to the subsequent mounting step. In this process, the semiconductor wafer undergoes dicing, cleaning and drying steps in the state of being attached to a pressure sensitive adhesive sheet and is transferred to the subsequent pickup and mounting steps. It is desired that the above pressure sensitive adhesive sheet employed in the steps from the semiconductor wafer dicing to the pickup have an adhesive strength which is so large as to securely hold the wafer (chips) in the dicing to drying steps but which is on such a level that no adhesive remains to the wafer (chips) in the pickup step. This type of pressure sensitive adhesive sheet was proposed in, for example, Japanese Patent Laid-open Publication Nos. 60(1985)-196956 and 60(1985)-223139. In the proposed pressure sensitive adhesive sheets, however, it was practically infeasible to completely nullify the adhesive strength (vertical peeling strength) at the pickup step and, irrespective of the efforts for reduction, the vertical peeling strength at the pickup step encountered a limit of about 100 to 300 g/10 mm sq. Therefore, in actually carrying out the above process, not only are the chips pushed upward from the back of the pressure sensitive adhesive sheet by means of a thrust needle to thereby separate the chips from the pressure sensitive adhesive sheet but also pickup of the chips is performed with the use of a suction collet.

Recently, various electronic components (chips) for preventing stealth and forgery are assembled into cards, for example, ID, memory, credit and cash cards. It is required that the electronic components to be assembled in these cards have very small thickness and have large surface area relative to the thickness so as to have large capacity.

The problem has surfaced such that the use of the above thrust needle in the pickup of chips of small thickness and large surface area would break the chips to thereby gravely lower the chip yield.

The present invention has been made with a view toward resolving the above problem of the prior art. An object of the present invention is to provide a process for producing a chip in which chips of small thickness and large surface area can easily be picked up, and another object of the present invention is to provide a pressure sensitive adhesive sheet suitable for use in the above process. That is, objects of the present invention are to provide a process for producing a chip in which chips can be picked up without the need to use any thrust needle and to provide a pressure sensitive adhesive sheet suitably employed in the above process.

SUMMARY OF THE INVENTION

The process for producing a chip according to the present invention comprises the steps of:

attaching an object to be diced on a pressure sensitive adhesive sheet comprising at least one layer of shrinkable film and a pressure sensitive adhesive layer;

dicing the object into chips, and shrinking the shrinkable film to thereby reduce an area in which the chips are in contact with the pressure sensitive adhesive.

In the present invention, it is preferred that the pressure sensitive adhesive layer be composed of an ultraviolet curable pressure sensitive adhesive. In this process, it is further preferred that a step of irradiating the pressure sensitive adhesive layer with ultraviolet rays be included prior to or subsequent to a shrinkage of the shrinkable film.

The pressure sensitive adhesive sheet according to the present invention is used in the above process for producing chip, and comprises at least one layer of shrinkable film and a pressure sensitive adhesive layer. In particular, it is preferred that the pressure sensitive adhesive sheet comprises an ordered array or stack made up of a nonshrinkable support film, a shrinkable film and a pressure sensitive adhesive layer piled or stacked in the aforsaid order.

DETAILED DESCRIPTION OF THE INVENTION

Figure 1:
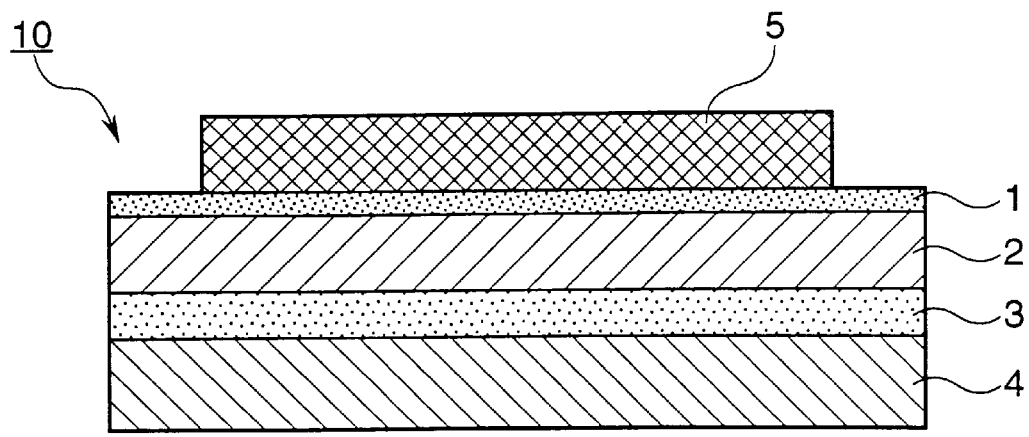
FIG. 1 shows one phase of step conducted in the process for producing a chip according to the present invention.

In the process for producing a chip according to the present invention, use is made of a pressure sensitive adhesive sheet comprising a substrate composed of at least one layer of shrinkable film and a pressure sensitive adhesive layer disposed thereon, that is, the pressure sensitive adhesive sheet according to the present invention.

Although the shrinkable film is not particularly limited, use of a thermally shrinkable film is preferred. The shrinkage ratio of the shrinkable film employed in the present invention preferably ranges from 10 to 90% and, still preferably, from 20 to 80%. The shrinkage ratio is calculated from the size prior to shrinkage and the size after shrinkage by the following formula:

$$\text{Shrinkage ratio (\%)} = \frac{(\text{size prior to shrinkage}) - (\text{size after shrinkage})}{(\text{size prior to shrinkage})} \times 100$$

In the use of the thermally shrinkable film, the above shrinkage ratio is calculated from the sizes of the film prior to and after heating at 120° C.

Various shrinkable films of the above type are known, and any thereof can be used in the present invention as long as the object to be diced does not suffer from adverse effects such as ion contamination therefrom. Examples of suitable shrinkable films include biaxially oriented films such as those of polyethylene terephthalate, polyethylene, polystyrene, polypropylene, nylon, urethane, polyvinylidene chloride and polyvinyl chloride.

The thickness of the above shrinkable film generally ranges from 5 to 300 μm, preferably, from 10 to 200 μm. In particular, thermally shrinkable polyethylene, polypropylene and polyethylene terephthalate films are preferably used as the shrinkable film.

Although the substrate of the pressure sensitive adhesive sheet for use in the process of the present invention may be composed of one layer of the above shrinkable film, it is preferably composed of at least two layers of plastic films. That is, the substrate may be composed of a single shrinkable film, a combination of at least two shrinkable films or a combination of shrinkable film or films with nonshrinkable film or films. Although the nonshrinkable film is not particularly limited, it is preferred that the nonshrinkable film have high water and heat resistances and be composed of a synthetic resin.

Examples of suitable nonshrinkable films include polyolefin films such as those of polyethylene, polypropylene, polybutene and polymethylpentene, a polyvinyl chloride film, a polyethylene terephthalate film, a polybutylene terephthalate film, a polybutadiene film, a polyurethane film and an ethylene vinyl acetate copolymer film. Moreover, use can be made of a film of a polymer of a compound having a carboxyl group as a polymer structural unit and a laminate of this film and a generally employed polymer film.

The thickness of the above nonshrinkable film generally ranges from 5 to 300 $\mu$m, preferably, from 10 to 200 $\mu$m.

The nonshrinkable film for use in the present invention generally exhibits a shrinkage ratio of below 10%.

The difference between the shrinkable film and the nonshrinkable film for use in the present invention resides in a difference in shrinkage ratio. For example, in the production of polyethylene film, two types of polyethylene films having different shrinkage ratios can be produced by appropriately setting production conditions, etc.

When the substrate of the pressure sensitive adhesive sheet according to the present invention is composed of at least two layers, the lamination of the shrinkable film and the other film is preferably conducted by bonding them together with the use of, for example, an adhesive. The order of the lamination of these layers is not particularly limited, and various layer combinations can be employed.

The combination of the substrate composed of at least two layers and the pressure sensitive adhesive layer can preferably be conducted in the following varieties:

(1) pressure sensitive adhesive layer/shrinkable film/ adhesive layer/nonshrinkable film;

(2) pressure sensitive adhesive layer/shrinkable film/ nonshrinkable film;

(3) pressure sensitive adhesive layer/shrinkable film/ adhesive layer/shrinkable film; and (4) pressure sensitive adhesive layer/shrinkable film/ shrinkable film.

The pressure sensitive adhesive layer side of the shrinkable film may be subjected to corona treatment or may have another layer such as a primer attached thereto for improving the adherence of the shrinkable film to the pressure sensitive adhesive.

The adhesive for use in the above film bonding is not particularly limited and generally used adhesives may be employed. Examples of suitable adhesives include pressure sensitive adhesives such as those based on an acrylic, a rubber and a silicone and thermoplastic or thermosetting adhesives such as those based on a polyester, a polyamide, an ethylene copolymer, an epoxy and a urethane. In particular, the formation of the adhesive layer from the pressure sensitive adhesive or a thermoplastic adhesive exhibiting an elastic modulus of $10^9$ dyn/cm$^2$ or below at the temperature shrinking the shrinkable film is preferred from the viewpoint that, even if the thickness of the shrinkable film is small, the shrinkage is scarcely constrained by the nonshrinkable film.

The pressure sensitive adhesive sheet having the above layer structure (1) is preferably used in the present invention.

In the present invention, the pressure sensitive adhesive layer may be irradiated with ultraviolet rays prior to or after shrinking the films, as described later. When the irradiation is effected, the films constituting the substrate must be transparent.

The pressure sensitive adhesive layer of the pressure sensitive adhesive sheet can be produced from various conventional pressure sensitive adhesives. These pressure sensitive adhesives are not particularly limited and some examples thereof include pressure sensitive adhesives based on a rubber, an acrylic, a silicone and a polyvinyl ether. Also, use can be made of pressure sensitive adhesives which are curable by radiation and pressure sensitive adhesives which foam when heated. Although depending on the properties of the materials of the pressure sensitive adhesive layer, the thickness of the pressure sensitive adhesive layer generally ranges from about 3 to 100 $\mu$m, preferably, from about 10 to 50 $\mu$m.

As mentioned above, various pressure sensitive adhesives are used without any particular limitation. For example, those described in Japanese Patent Publication No. 1(1989)-56112 and Japanese Patent Laid-Open Publication No. 7(1995)-135189 can preferably be used as the pressure sensitive adhesives curable by radiation (curable by light, ultraviolet rays or electron beams), which, however, do not limit the radiation curable pressure sensitive adhesives for use in the present invention. Nevertheless, the use of pressure sensitive adhesives curable by ultraviolet rays is especially preferred in the present invention.

The process for producing a chip according to the present invention will be described in detail below in conformity with the above preferred embodiment, referring to the appended drawings.

Referring to FIG. 1, a pressure sensitive adhesive sheet 10 comprising a pressure sensitive adhesive layer 1, a shrinkable film 2, an adhesive layer 3 and a nonshrinkable film 4 stacked in this order is employed in accordance with one preferred embodiment of the present invention. The above pressure sensitive adhesive curable by ultraviolet rays is preferably used in the pressure sensitive adhesive layer 1. An ultraviolet permeable polyethylene terephthalate film having a thermal shrinkage ratio of 20 to 80% is most suitably used as the shrinkable film 2. The adhesive layer 3 has the function of bonding the shrinkable film 2 and the nonshrinkable film 4 together and it is especially preferred to use an acrylic pressure sensitive adhesive or urethane thermoplastic adhesive therein. An ultraviolet permeable polyethylene or polyethylene terephthalate is most suitably used as the nonshrinkable film 4.

In the process for producing a chip according to the present invention, an object to be diced 5 is attached on the pressure sensitive adhesive layer 1 of the above pressure sensitive adhesive sheet 10 and cut (diced) into chips 6.

The object to be diced 5 includes, for example, a semiconductor wafer having a circuit formed thereon such as Si wafer, Ge wafer and GaAs wafer;

a ceramic plate such as alumina, zirconia, silicon nitride and silicon carbide, insulating substrate and electronic devices;

a glass plate, quartz and the like used as optical element;

a wiring board such as printed board;

a lead frame made of iron or copper;

a tape for TAB (tape automated bonding);

resin molded articles; and composite devices of the above, such as a semiconductor mounted on the lead frame, resin sealed thereof and resin sealed semiconductor mounted on the tape for TAB.

Figure 2:
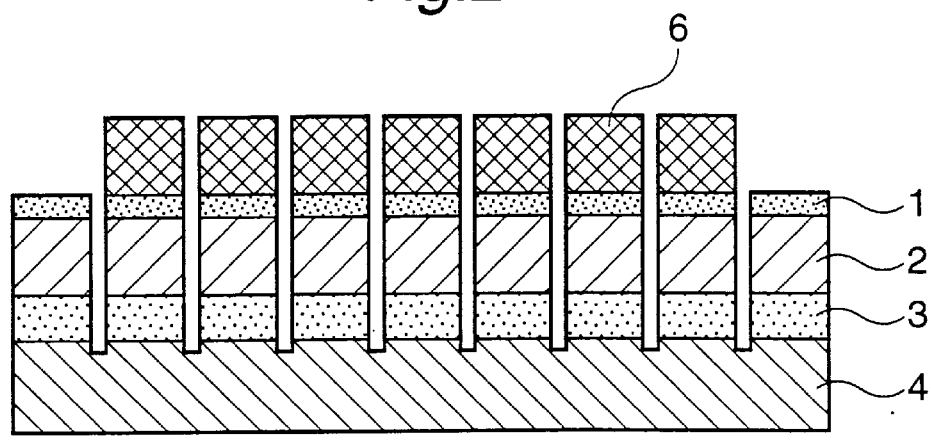
FIG. 2 shows another phase of step conducted in the process for producing a chip according to the present invention.

The cutting depth is preferably such that the shrinkable film 2 is completely cut while the cutting of the nonshrinkable film 4 is halted before reaching the middle thereof (see FIG. 2). The shrinkage restricting force is weakened by the complete cutting of the shrinkable film 2, so that the area in which the chips 6 are in contact with the pressure sensitive adhesive layer 1 can satisfactorily be reduced.

Subsequently, the shrinkable film 2 is shrunk by appropriate means required. When a thermally shrinkable film is employed, the shrinkage of the shrinkable film 2 is effected by heating the laminate of the chips 6 and the pressure sensitive adhesive sheet 10 at 80 to 150° C.

Figure 3:
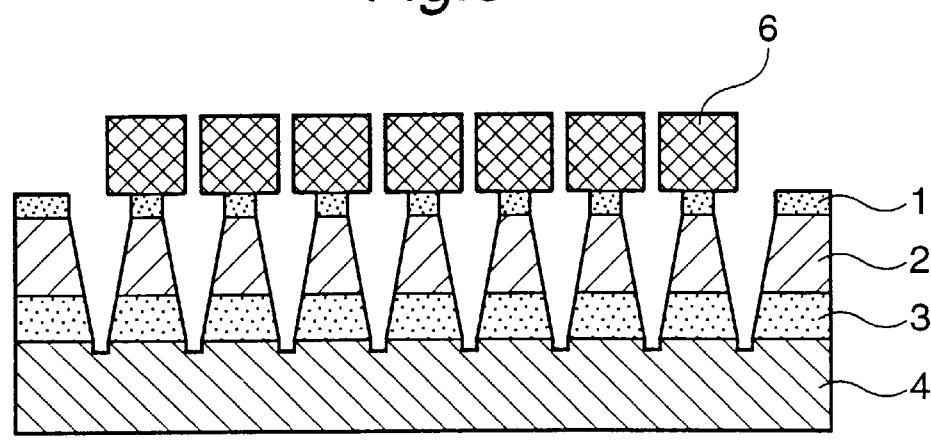
FIG. 3 shows a further phase of step conducted in the process for producing a chip according to the present invention.

The above shrinkage of the shrinkable film 2 causes the pressure sensitive adhesive layer 1 disposed thereon to deform in conformity with the shrinkage of the shrinkable film 2, so that the area in which the chips 6 are in contact with the pressure sensitive adhesive layer 1 is reduced (see FIG. 3). As a result, the adhesive strength (vertical peeling strength) between the chips 6 and the pressure sensitive adhesive layer 1 is reduced to thereby enable easily picking up the chips with the use of a suction collet only without the need to use any thrust needle.

When the pressure sensitive adhesive layer 1 is composed of the ultraviolet curable pressure sensitive adhesive, it is especially preferred that the pressure sensitive adhesive layer 1 be irradiated with ultraviolet rays prior to or after the above shrinkage to thereby cure the pressure sensitive adhesive layer 1 with the result that the adhesive strength thereof is reduced. The curing of the pressure sensitive adhesive layer enables further reducing the vertical peeling strength with the result that not only is the pickup of the chips 6 facilitated but also the breakage of the chips 6 can be prevented.

The vertical peeling strength of the pressure sensitive adhesive layer 1 prior to the shrinkage of the shrinkable film 2 generally ranges from 100 to 800 g/10 mm sq., preferably, from 100 to 500 g/10 mm sq. and, still preferably, from 100 to 300 g/10 mm sq., although these do not limit the pressure sensitive adhesive layer 1. Further, the vertical peeling strength of peelable type pressure sensitive adhesive after the shrinkage of the shrinkable film 2 is generally 200 g/10 mm sq. or less. Still further, the vertical peeling strength of radiation curable pressure sensitive adhesive after the shrinkage and the radiation curing is generally 80 g/10 mm sq. or less, preferably, 50 g/10 mm sq. or less and, still preferably, 20 g/10 mm sq. or less.

The pressure sensitive adhesive sheet of the present invention is used in the above process for producing chip, and has the same structure as that of the pressure sensitive adhesive sheet used in the process for producing a chip according to the present invention and preferred forms thereof are the same as described above. The pressure sensitive adhesive sheet of the present invention can have any of various forms such as tape and label forms. Before use, a release film may be applied to the surface of the pressure sensitive adhesive layer in order to protect the pressure sensitive adhesive layer.

The pressure sensitive adhesive sheet of the present invention can suitably be used in not only the above process for producing a chip but also uses such as surface protection and temporary fixing of electronic device products.

EFFECT OF THE INVENTION

As apparent from the foregoing, the present invention utilizes the shrinking property of a film to thereby markedly reduce the vertical peeling strength between the pressure sensitive adhesive layer and the chips, so that the chips can be picked up without the need to use any thrust needle. Accordingly, the chip breakage at the time of pickup can be prevented to thereby enable improving chip yield.

EXAMPLE

The present invention will be illustrated in detail below with reference to the following Examples which in no way limit the scope of the invention.

In the following Examples and Comparative Examples, the vertical peeling strength was measured in the following manner.

[Vertical peeling strength]

An 8 inch silicon wafer of 200 $\mu$m in thickness was attached on the pressure sensitive adhesive sheet produced in each of the following Examples and Comparative Examples and bonded to a flat frame. Dicing was performed by means of a 35 $\mu$m thick diamond blade into 10 mm×10 mm chips. Full cut dicing was performed such that the dicing was made to such a cutting depth that the film remains uncut by 80 $\mu$m in both the Examples and Comparative Examples.

Thereafter, the pressure sensitive adhesive layer was irradiated with ultraviolet rays (when use was made of an ultraviolet curable pressure sensitive adhesive) and the shrinkable film was shrunk. A hook was secured to the top of each chip with the use of an epoxy adhesive, and the peeling strength was measured by means of a universal tensile tester.

EXAMPLE 1

1(1) Production of pressure sensitive adhesive composition 1:

100 parts by weight of an acrylic pressure sensitive adhesive (copolymer of n-butyl acrylate and acrylic acid), 200 parts by weight of a urethane acrylate oligomer having a molecular weight of 7000, 10 parts by weight of a crosslinking agent (isocyanate type) and 10 parts by weight of an ultraviolet curable reaction initiator (benzophenone type) were mixed together, thereby obtaining a pressure sensitive adhesive composition.

1(2) Lamination of shrinkable film 2 to pressure sensitive adhesive layer 1:

A 25 $\mu$m thick polyethylene terephthalate film having undergone release treatment was coated with the pressure sensitive adhesive composition obtained in step 1(1) above so that the thickness of the layer 1 was 10 $\mu$m and heated at 100° C. for 1 min. Thereafter, a thermally shrinkable polyethylene terephthalate film (having a thickness of 30 $\mu$m and a shrinkage ratio of 50% at 120° C.) was bonded to the pressure sensitive adhesive side of the coated polyethylene terephthalate film, thereby obtaining a shrinkable pressure sensitive adhesive film.

1(3) Production of pressure sensitive adhesive 3 for substrate bonding:

100 parts by weight of an acrylic pressure sensitive adhesive (copolymer of n-butyl acrylate and acrylic acid) and 2 parts by weight of a crosslinking agent (isocyanate type) were mixed together, thereby obtaining a pressure sensitive adhesive composition for substrate bonding.

1(4) Production of pressure sensitive adhesive sheet:

A nonshrinkable polyethylene terephthalate film (having a thickness of 100 $\mu$m and a shrinkage ratio of 0.1% at 120° C.) was coated with the pressure sensitive adhesive composition produced in step 1(3) above so that the thickness of the layer 3 was 25 $\mu$m and heated at 100° C. for 1 min, thereby obtaining a nonshrinkable pressure sensitive adhesive film. The resultant nonshrinkable pressure sensitive adhesive film on its pressure sensitive adhesive side was bonded to the shrinkable film substrate side of the shrinkable pressure sensitive adhesive film produced in step 1(2) above, thereby obtaining an ultraviolet curable pressure sensitive adhesive sheet 10.

The vertical peeling strength of the obtained pressure sensitive adhesive sheet was measured in the above-mentioned manner. The shrinkable film was shrunk by allowing the same to stand still in a 120° C. atmosphere for 1 min. The results are given in Table 1.

EXAMPLE 2

An ultraviolet curable pressure sensitive adhesive sheet was produced in the same manner as in Example 1, except that the shrinkable film was replaced by a thermally shrinkable polyethylene film (having a thickness of 30 μm and a shrinkage ratio of 30% at 120° C.).

The results are given in Table 1.

EXAMPLE 3

A repeeling type pressure sensitive adhesive sheet was produced in the same manner as in Example 1, except that the pressure sensitive adhesive composition disposed on the shrinkable film was prepared by mixing together 100 parts by weight of a repeeling type acrylic pressure sensitive adhesive (copolymer of n-butyl acrylate and 2-hydroxyethyl acrylate) and 10 parts by weight of a crosslinking agent (isocyanate type).

The results are given in Table 1.

COMPARATIVE EXAMPLE 1

The same procedure as in Example 1 was repeated except that use was made of a substrate composed only of a nonshrinkable polyethylene terephthalate film of 100 μm in thickness having a shrinkage ratio of 0.1% at 120° C. The results are given in Table 1.

COMPARATIVE EXAMPLE 2

The same procedure as in Example 3 was repeated except that use was made of a substrate composed only of a nonshrinkable polyethylene terephthalate film of 100 μm in thickness having a shrinkage ratio of 0.1% at 120° C. The results are given in Table 1.

TABLE 1

|  | Vertical peeling strength (g/10 mm sq.) |
|---|---|
| Example 1 | 0–5 |
| Example 2 | 30–50 |
| Example 3 | 100–150 |
| Comp. Ex. 1 | 500 |
| Comp. Ex. 2 | 700 |

What is claimed is:

1. A pressure sensitive adhesive sheet for producing a chip, comprising in an ordered stack: a nonshrinkable support film having a shrinkage ratio of less than 10% upon heating to 120° C., a shrinkable film having a shrinkage ratio of 10–90% upon heating to 120° C., and a pressure sensitive adhesive layer.

2. The pressure sensitive adhesive sheet as claimed in claim 1, wherein the nonshrinkable support film and the shrinkable film are bonded by an adhesive layer having an elastic modulus of $10^9$ dyn/cm$^2$ or less at a temperature of shrinking the shrinkable film.

3. The pressure sensitive adhesive sheet as claimed in claim 2, wherein both the nonshrinkable support film and the shrinkable film are made of polyethylene terephthalate.

4. The pressure sensitive adhesive sheet as claimed in claim 1, wherein both the nonshrinkable support film and the shrinkable film are made of polyethylene terephthalate.

* * * * *

UNITED STATES PATENT AND TRADEMARK OFFICE
CERTIFICATE OF CORRECTION

PATENT NO.  : 5,976,691
DATED       : November 2, 1999
INVENTOR(S) : Hayato Noguchi et al.

It is certified that error appears in the above-identified patent and that said Letters Patent is hereby corrected as shown below:

Title Page, under [56] References Cited, OTHER PUBLICATIONS,
    Reference 6:  "5-132946" should read -- 5-32946 --.

Title Page, [57] ABSTRACT, Line 2 "a attaching" should read
    -- attaching --.

Signed and Sealed this

Nineteenth Day of September, 2000

Attest:

Q. TODD DICKINSON

*Attesting Officer*         *Director of Patents and Trademarks*